(12) United States Patent
Lin et al.

(10) Patent No.: US 8,670,227 B2
(45) Date of Patent: Mar. 11, 2014

(54) SIGNAL TRANSMISSION DEVICE

(75) Inventors: Kuan-Yu Lin, New Taipei (TW); Wei Wang, New Taipei (TW); Chen-Wang Chen, New Taipei (TW)

(73) Assignee: Ability Enterprise Co., Ltd., Taipei (TW)

(*) Notice: Subject to any disclaimer, the term of this patent is extended or adjusted under 35 U.S.C. 154(b) by 375 days.

(21) Appl. No.: 13/092,019

(22) Filed: Apr. 21, 2011

(65) Prior Publication Data

US 2012/0140384 A1 Jun. 7, 2012

(30) Foreign Application Priority Data

Dec. 7, 2010 (TW) .................................. 99142673 A

(51) Int. Cl.
*G06F 1/16* (2006.01)
(52) U.S. Cl.
USPC ............ 361/679.31; 361/679.32; 361/679.58; 439/135; 439/928; 439/928.1
(58) Field of Classification Search
USPC .................................................. 361/679.32
See application file for complete search history.

(56) References Cited

U.S. PATENT DOCUMENTS

| 7,025,275 | B2* | 4/2006 | Huang et al. .................. 235/486 |
| 7,042,715 | B2* | 5/2006 | Lin et al. ..................... 361/679.4 |
| 7,740,494 | B2* | 6/2010 | Lin et al. ........................ 439/131 |
| 8,189,101 | B2* | 5/2012 | Cummings et al. ........... 348/376 |
| 8,189,327 | B2* | 5/2012 | Chang ....................... 361/679.31 |
| 2010/0075517 | A1* | 3/2010 | Ni et al. ......................... 439/131 |
| 2010/0221937 | A1* | 9/2010 | Choi et al. ..................... 439/142 |
| 2010/0232116 | A1* | 9/2010 | Paratore ........................ 361/724 |
| 2010/0279518 | A1* | 11/2010 | Watanabe et al. ............... 439/40 |
| 2011/0273832 | A1* | 11/2011 | Tracy et al. .............. 361/679.31 |
| 2011/0304971 | A1* | 12/2011 | Kelley et al. ............ 361/679.31 |

* cited by examiner

*Primary Examiner* — Anthony Q Edwards
(74) *Attorney, Agent, or Firm* — Rabin & Berdo, P.C.

(57) ABSTRACT

A signal transmission device is provided. The signal transmission device comprises a linked unit, a switch button, a data connector and a cover. The linked unit includes a first shaft, a second shaft, a first elastomer and a second elastomer. The switch button is attached/disposed on the linked unit. The data connector rotates and expands according to the first shaft and the first elastomer. The cover has a storage device to accommodate and cover the data connector. The cover rotates and expands according to the second shaft and the second elastomer.

20 Claims, 3 Drawing Sheets

SIGNAL TRANSMISSION DEVICE

CROSS-REFERENCE TO RELATED APPLICATIONS

The entire contents of Taiwan Patent Application No. 099142673, filed on Dec. 7, 2010, from which this application claims priority, are incorporated herein by reference.

BACKGROUND OF THE INVENTION

1. Field of the Invention

The present invention generally relates to an extendable signal transmission device, and more particularly to a signal transmission device of a portable electronic appliance which is accommodated in the portable electronic appliance and can be extended out via a button.

2. Description of Related Art

Modern portable electronic appliances, such as digital cameras, digital video cameras, mobile phones, notebook personal computers or tablet personal computers, etc., with advantages of light weight, small size, powerful functions and easy to carry are widely used by consumers. Some portable electronic appliances such as digital cameras, digital video cameras usually need additional signal transmission line to connect other electronic appliances or systems to transmit data such as photographs or video files or to recharge batteries so that users have to carry the additional signal transmission line beside the portable electronic appliance. Thus it would be impossible to proceed file transfer or battery recharge and is inconvenient for the user who does not have the additional signal transmission line in hand.

The invention provides an extendable signal transmission device of a portable electronic appliance which can enable the user to proceed file transfer or battery recharge any time without any signal transmission line and effectively improve the convenience of the portable electronic appliance.

SUMMARY OF THE INVENTION

The invention provides an extendable signal transmission device applicable to any portable electronic appliance which needs additional transmission line to connect other electronic system for data transmission or battery recharge. Through the design of elastically extending out, the user can directly extend the data connector out via a switch button. During the retraction of the data connector, a cover is used to accommodate the data connector.

According to the object set forth, one embodiment of the present invention provides a signal transmission device comprising a linked unit, a switch button, a data connector and a cover. The linked unit has a first shaft, a second shaft, a first elastomer and a second elastomer. The switch button is disposed on the linked unit. The data connector rotates and expands according to the first shaft and the first elastomer. The cover has a storage device to accommodate and cover the data connector, the cover rotates and expands according to the second shaft and the second elastomer.

Another embodiment of the present invention provides a portable electronic appliance comprising a main frame and a signal transmission device in the main frame. The signal transmission device comprises a linked unit, a switch button, a data connector, a cover and a bolt. The linked unit has a first shaft, a second shaft, a first elastomer and a second elastomer. The switch button is disposed on the linked unit. The data connector rotates and expands according to the first shaft and the first elastomer. The cover has a storage device to accommodate and cover the data connector, the cover rotates and expands according to the second shaft and the second elastomer. The bolt is used to secure the cover, wherein when the cover and the data connector are retracted the bolt secures the cover, when the switch button is moved by an applied force, the bolt releases the cover so that the data connector and the cover rotate and extend out.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

DETAILED DESCRIPTION OF THE INVENTION

The detailed description of the present invention will be discussed in the following embodiments in accordance with corresponding drawings which are not intended to limit the scope of the present invention, and can be adapted for other applications. Beside the detailed description, the invention can be made and performed by other replacement, modified and equivalent embodiments which are included in the scopes of the invention and the claims. In the description of the present invention, a plurality of detailed features are provided to enable one with ordinary skill in the art to make and use the invention. However, the invention can still be performed while some detailed features are omitted. Furthermore, well-known process steps or elements are not described in detail. While drawings are illustrated in detail, it is appreciated that the scale of each component may not be expressly exact.

Figure 1:
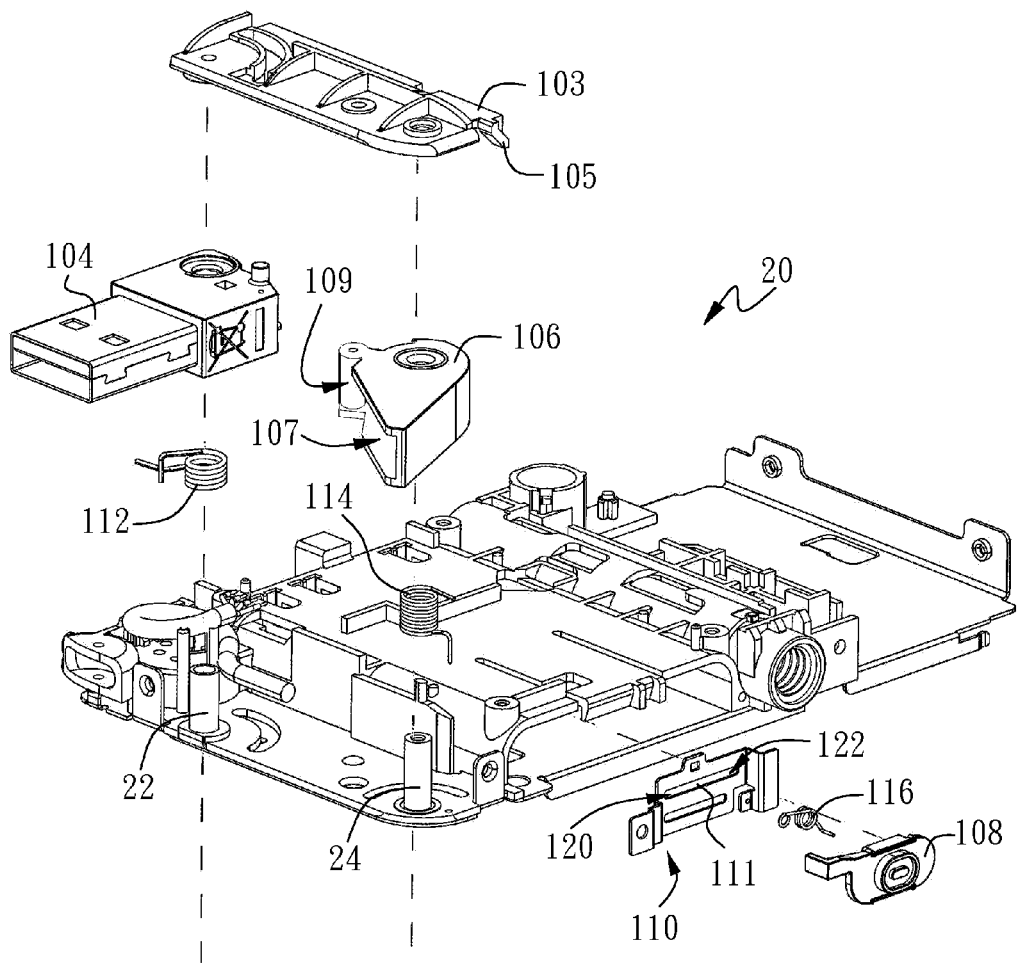
FIG. 1 shows a partial exploded view of a portable electronic appliance according to one embodiment of the invention.

Referring to FIG. 1, a partial exploded view of a portable electronic appliance according to one embodiment of the invention is shown. The portable electronic appliance includes a signal transmission device 10 and a main frame 20, wherein the signal transmission device 10 is in the main frame 20. The portable electronic appliance comprises, but is not limited to, handheld PC, personal digital assistant (PDA), MPEG audio player 3 (MP3), global positioning system (GPS), mobile communication devices, digital camera and digital video camera, any electronic appliance which applies data connectors is included in the scope of the invention. The possible image capture system (not shown), signal processing system (not shown), control system (not shown) and data storage system (not shown) which may be included in the electronic appliance are installed in the main frame 20.

As shown in FIG. 1, the signal transmission device 10 comprises a data connector 104, a cover 106 and a switch button 108. The signal transmission device 10 further comprises a frame component 103, elastomers 112, 114 and 116. The data connector 104 includes, but is not limited to, a Universal Serial Bus (USB) data connector or an IEEE 1394 data connector.

Referring again to FIG. 1, the data connector 104, the cover 106, and the elastomers 112 and 114 are assembled on the main frame 20 and pivot the rotation axes/pivots of the main frame 20 through the combination or securing between the frame component 103 and the main frame 20 so that the data connector 104 and the cover 106 rotates via the elastomers 112 and 114 according to rotation axes 22 and 24 of the main frame 20. The elastomers 112 and 114 comprise torsion springs. The data connector 104 rotates and expands through the shaft 22 and the elastomer 112 of a linked unit. The cover 106 has a storage device 107 to accommodate and cover the data connector 104. The cover 106 rotates and expands through the shaft 24 and the elastomer 114 of the linked unit. In order to accommodate the data connector 104, the rotation directions of the cover 106 and the data connector 104 are opposite to each other. The rotation axes 22 and 24 of the main frame 20 and the elastomers 112 and 114 constitute the linked unit. Whenever a force is applied upon the data connector 104 to rotate, the connector portion or front end of the data connector 104 will lean against a post 109 of the cover 106 and the force will drive the cover 106 to rotate according to the axes 22 and 24 through the data connector 104 and the post 109 and cause the elastomers 112 and 114 to deform. When the force is not applied upon, the data connector 104 and the cover 106 will rotate and expand due to the recovery force of the elastomers 112 and 114 after deformation and thus constitute the linked unit. A fixing component 110 is mounted on the main frame 20. The fixing component 110 has a track 111 so that the switch button 108 can move between an original position 120 and an activation position 122 of the track 111. The switch button 108 will be back to the original position 120 of the track 111 via the elastomer 116 after the force is no longer applied. The elastomer 116 comprises a torsion spring and is mounted between the fixing component 110 and the linked unit. It is to be appreciated that many well-known elements of the portable electronic appliance shown in FIG. 1 are omitted and the components in the figure are not necessarily arranged in the sequence of assembling. The omitted well-known features can be practiced by any related art and anyone with ordinary skill in the art can make and use the invention based on ordinary level of skill in the art.

Figure 2:
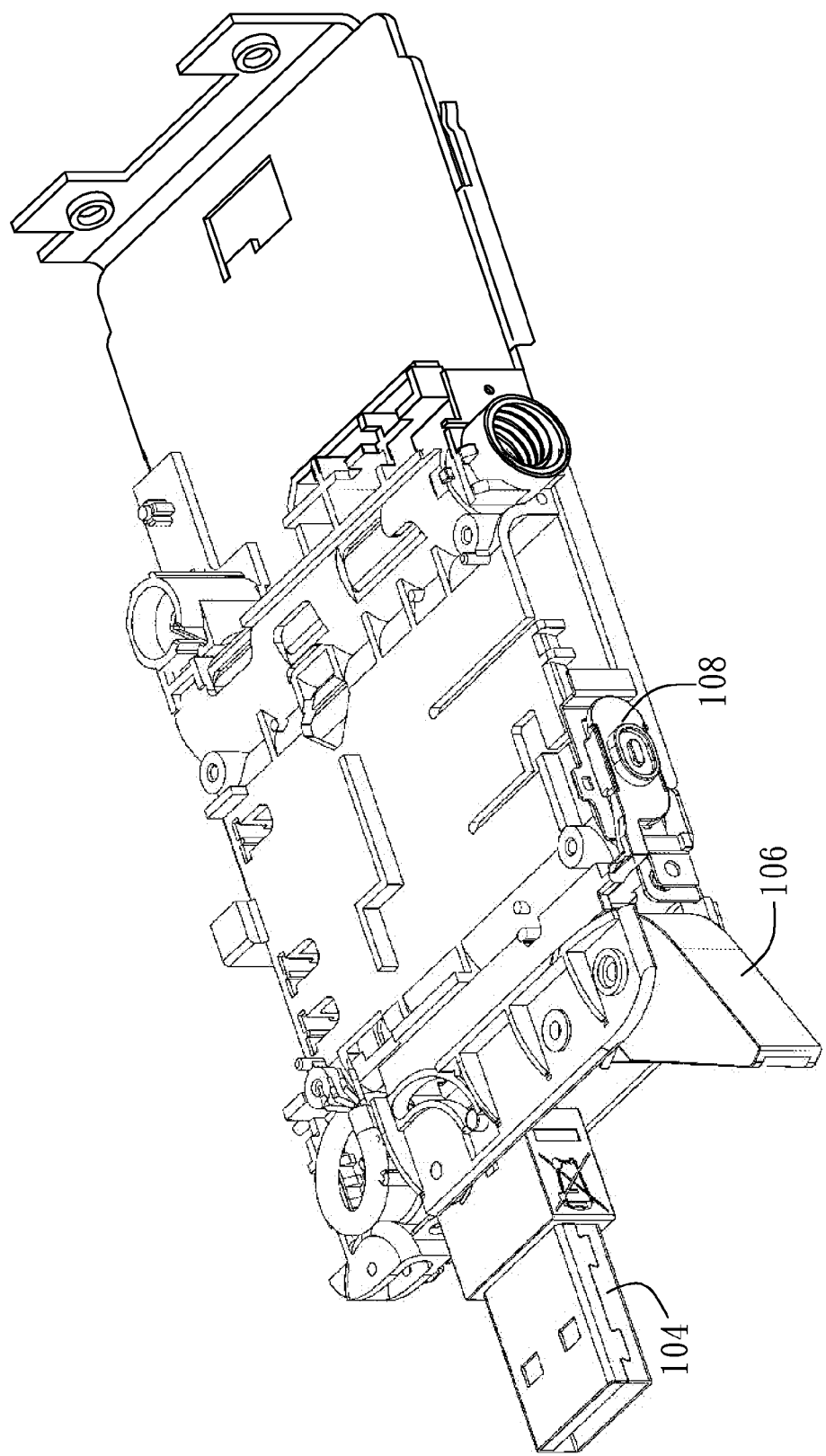
FIG. 2 shows a schematic view of expanding out of the data connector and the cover of a portable electronic appliance according to one embodiment of the invention.

FIG. 2 shows a schematic view of expanding out of the data connector and the cover of a portable electronic appliance according to one embodiment of the invention. When a user wants to use the data connector of the portable electronic appliance, through switching the switch button 108 to move the switch button 108 along the track 111 to the activation position 122 and to push a bolt 105 to release the cover 106, the cover 106 and the data connector 104 can simultaneously rotate and expand due to the recovery force of the elastomers 112 and 114. If the elastomers 112 and 114 comprise torsion springs, the cover 106 and the data connector 104 will simultaneously rotate and expand due to the recovery force of the torsion springs after deformation. The switch button 108 is then back to the original position 120 of the track 111 due to the elastomer 116. If the elastomer 116 comprises a torsion spring, the switch button 108 will be back to the original position 120 of the track 111 due to the recovery force of the torsion spring.

Figure 3:
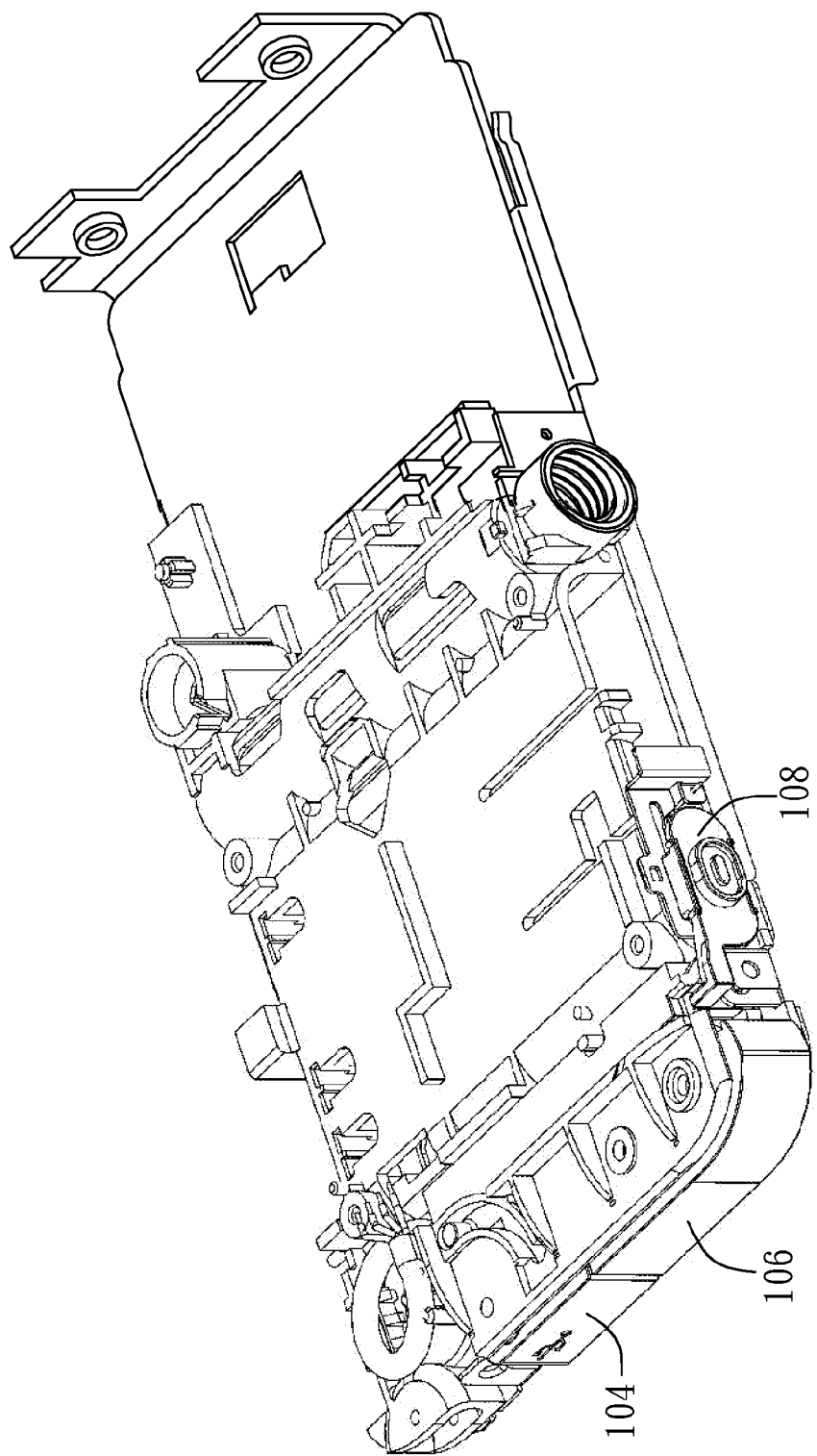
FIG. 3 shows a schematic view of retracting back of the data connector and the cover of a portable electronic appliance according to one embodiment of the invention.

FIG. 3 shows a schematic view of retracting back of the data connector and the cover of a portable electronic appliance according to one embodiment of the invention. Whenever the user applies a force to press the data connector 104, the connector portion or front end of the data connector 104 will lean against the post 109 of the cover 106 and the force will drive the cover 106 to rotate through the data connector 104 applying force upon the post 109. The storage device 107 of the cover 106 covers and accommodates the data connector 104 and the cover 106 is secured by the bolt 105 so that the cover 106 and the data connector 104 can be accommodated in the portable electronic appliance simultaneously. It will be appreciated by those skilled in the art that various modifications may be made without departing from the scope of the present invention, which is intended to be limited solely by the appended claims.

The extendable signal transmission device of the invention comprises a switch button, a cover and a data connector. Through elastically extendable design, the user can make the data connector directly extends out via the switch button. When the user pushes the switch button, the bolt used to secure the cover is moved aside to release and extend out the cover so that the data connector can also extend out from the portable electronic appliance. When the user presses the data connector, the data connector can drive the cover to retract both back into the portable electronic appliance.

The invention provides an extendable signal transmission device applicable to any portable electronic appliance which needs additional transmission line to connect other electronic system for data transmission or battery recharge. The portable electronic appliance which uses signal transmission device of the invention does not need additional transmission line to proceed data transmission and battery recharge. Through the built-in signal transmission device in the portable electronic appliance, portable electronic appliances can be directly connected to other systems such as personal computers or notebook personal computers without using additional transmission line and thus improves the convenience of usage of the portable electronic appliance. Moreover, the elastically extendable signal transmission device of the invention not only can improve the conveniences of carry, data transmission and battery recharge, but also can improve the convenience of operation of the portable electronic appliance through a switch button to use the data connector in the signal transmission device.

Although specific embodiments have been illustrated and described, it will be appreciated by those skilled in the art that various modifications may be made without departing from the scope of the present invention, which is intended to be limited solely by the appended claims.

What is claimed is:

1. A signal transmission device, comprising:
   a linked unit having a first shaft, a second shaft, a first elastomer, a second elastomer and a torsion spring;
   a switch button disposed on the linked unit;
   a data connector expanded by the first elastomer according to the first shaft; and
   a cover expanded by the second elastomer through the second shaft of the linked unit, and the switch button is pulled toward an original position by the torsion spring.

2. The signal transmission device of claim 1 further comprising a bolt to lock the cover when the cover and the data connector are retracted.

3. The signal transmission device of claim 2, wherein when the switch button is moved from the original position to an activation position, the bolt releases the cover so that the data connector and the cover extend outwardly.

4. The signal transmission device of claim 1 further comprising a fixing component, the torsion spring being mounted between the fixing component and the linked unit.

5. The signal transmission device of claim 4, wherein the fixing component has a track, on which the original position and the activation position are set, so that the switch button is moved between the original position and the activation position of the track.

6. The signal transmission device of claim 1, wherein the first elastomer comprises a further torsion spring.

7. The signal transmission device of claim 1, wherein the second elastomer comprises a further torsion spring.

8. The signal transmission device of claim 1, wherein the rotation of the data connector is opposite to that of the cover.

9. The signal transmission device of claim 1, wherein the cover comprises a storage device to accommodate the data connector.

10. A portable electronic appliance, comprising a signal transmission device according to claim 1.

11. A portable electronic appliance, comprising:
a main frame; and
a signal transmission device in the main frame, comprising:
a linked unit having a first shaft, a second shaft, a first elastomer, a second elastomer and a torsion spring;
a switch button disposed on the linked unit;
a data connector expanding according to the first shaft by the first elastomer;
a cover expanding by the second elastomer through the second shaft of the linked unit; and
a bolt that locks the cover, wherein the switch button is pulled back to an original position via the torsion spring after an applied force is removed.

12. The portable electronic appliance of claim 11, wherein the cover comprises a storage device to accommodate the data connector.

13. The portable electronic appliance of claim 12, wherein the bolt locks the cover when the data connector is retracted in the storage device of the cover; and wherein when the switch button is moved by an applied force, the bolt releases the cover so that the data connector and the cover rotate and extend outwardly.

14. The portable electronic appliance of claim 11 further comprising a fixing component, the torsion spring being mounted between the fixing component and the linked unit.

15. The portable electronic appliance of claim 14, wherein the fixing component has a track with the original position and an activation position so that the switch button is movable between the original position and the activation position.

16. The portable electronic appliance of claim 11, wherein the first elastomer comprises a further torsion spring.

17. The portable electronic appliance of claim 11, wherein the second elastomer comprises a further torsion spring.

18. The portable electronic appliance of claim 11, wherein the rotation of the data connector is opposite to that of the cover.

19. A signal transmission device, having a linked unit, a switch button and a fixing component, the linked unit having a first shaft, a second shaft, a first elastomer, a second elastomer and a torsion spring, the switch button movably disposed on the linked unit, the signal transmission device comprising:
a data connector expanded by the first elastomer according to the first shaft; and
a cover expanded by the second elastomer through the second shaft;
wherein the fixing component comprises a track with an original position, the torsion spring is mounted between the fixing component and the switch button, and the switch button is pulled back to the original position via the torsion spring after an applied force is removed.

20. A portable electronic appliance, comprising a signal transmission device according to claim 19.

* * * * *